US012652967B2

(12) United States Patent
Fumagalli et al.

(10) Patent No.: US 12,652,967 B2
(45) Date of Patent: Jun. 9, 2026

(54) TECHNOLOGIES FOR SEMICONDUCTOR DEVICES INCLUDING AMORPHOUS SILICON

(71) Applicant: Intel Corporation, Santa Clara, CA (US)

(72) Inventors: Luca Fumagalli, Rio Rancho, NM (US); Errol Todd Ryan, Albuquerque, NM (US); Jing Yuwen, Albuquerque, NM (US); David M. Fryauf, Rio Rancho, NM (US)

(73) Assignee: Intel Corporation, Santa Clara, CA (US)

( * ) Notice: Subject to any disclaimer, the term of this patent is extended or adjusted under 35 U.S.C. 154(b) by 216 days.

(21) Appl. No.: 17/735,529

(22) Filed: May 3, 2022

(65) Prior Publication Data

US 2023/0363297 A1     Nov. 9, 2023

(51) Int. Cl.
*H10N 70/20*          (2023.01)
*H10B 63/00*          (2023.01)
*H10N 70/00*          (2023.01)

(52) U.S. Cl.
CPC ........... *H10N 70/231* (2023.02); *H10B 63/84* (2023.02); *H10N 70/023* (2023.02); *H10N*

*70/063* (2023.02); *H10N 70/841* (2023.02); *H10N 70/882* (2023.02); *H10N 70/8845* (2023.02)

(58) Field of Classification Search
CPC .............................. H10N 70/00; H10B 63/00
See application file for complete search history.

(56) References Cited

U.S. PATENT DOCUMENTS

2022/0102625 A1 *   3/2022  Chandrasekaran .. H10N 70/841

* cited by examiner

*Primary Examiner* — Marvin Payen
(74) *Attorney, Agent, or Firm* — Alliance IP, LLC

(57) ABSTRACT

Techniques for semiconductor devices including amorphous silicon are disclosed. In the illustrative embodiment, trenches are etched through several layers of a memory during manufacture, including through a phase-change layer. To protect the phase-change layer during further processing steps, amorphous silicon is applied to the phase-change layer using low-temperature chemical vapor deposition, which can be done without exceeding the melting point of the phase-change layer. The amorphous silicon can be oxidized, forming a protective silicon oxide layer around the phase-change layer.

18 Claims, 14 Drawing Sheets

ACCESS CIRCUITRY 342

ACCESS LINE 304

ELECTRODE 308

STORAGE MATERIAL 302

ELECTRODE 310

ACCESS LINE 306

300

600

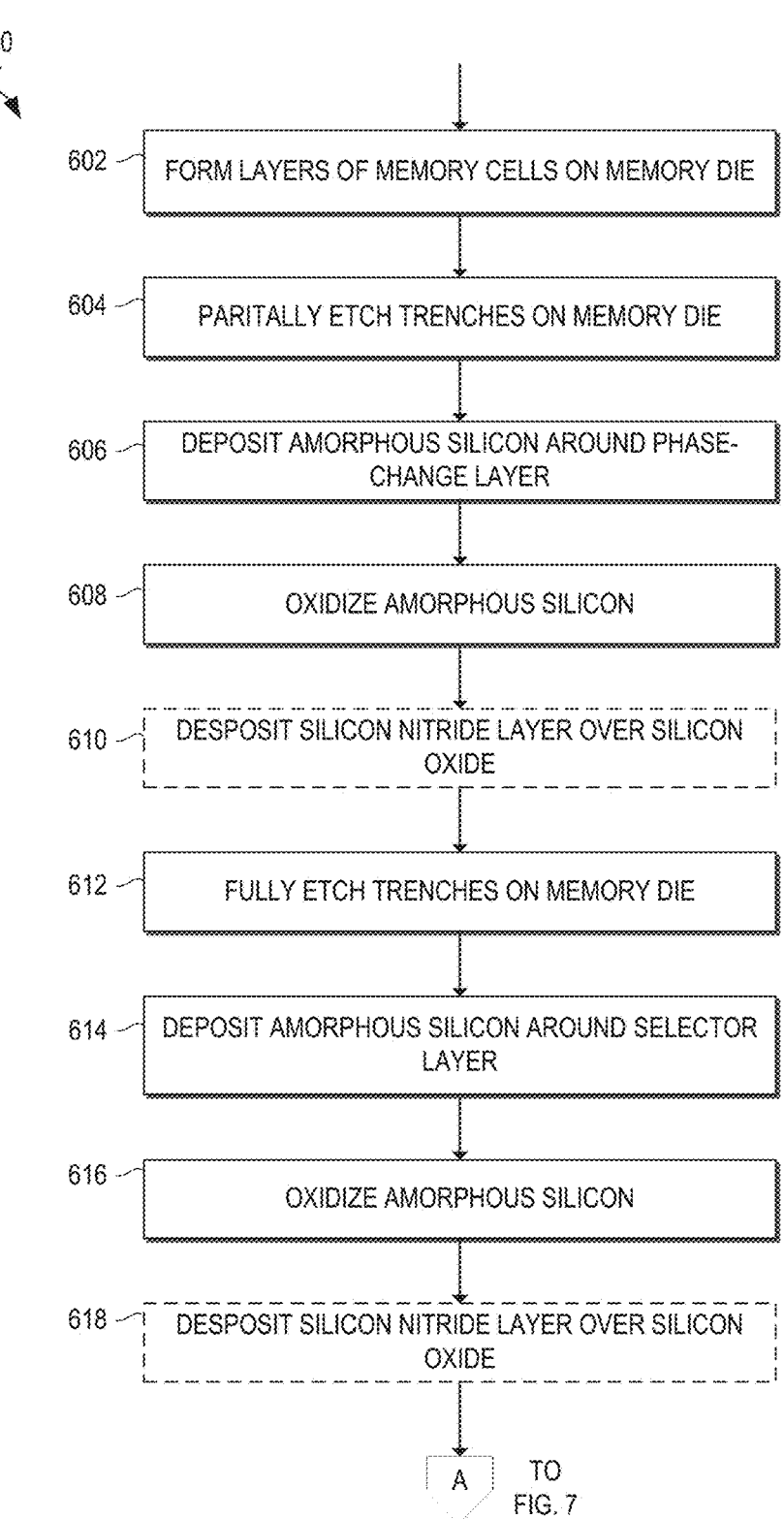

602 — FORM LAYERS OF MEMORY CELLS ON MEMORY DIE

604 — PARITALLY ETCH TRENCHES ON MEMORY DIE

606 — DEPOSIT AMORPHOUS SILICON AROUND PHASE-CHANGE LAYER

608 — OXIDIZE AMORPHOUS SILICON

610 — DESPOSIT SILICON NITRIDE LAYER OVER SILICON OXIDE

612 — FULLY ETCH TRENCHES ON MEMORY DIE

614 — DEPOSIT AMORPHOUS SILICON AROUND SELECTOR LAYER

616 — OXIDIZE AMORPHOUS SILICON

618 — DESPOSIT SILICON NITRIDE LAYER OVER SILICON OXIDE

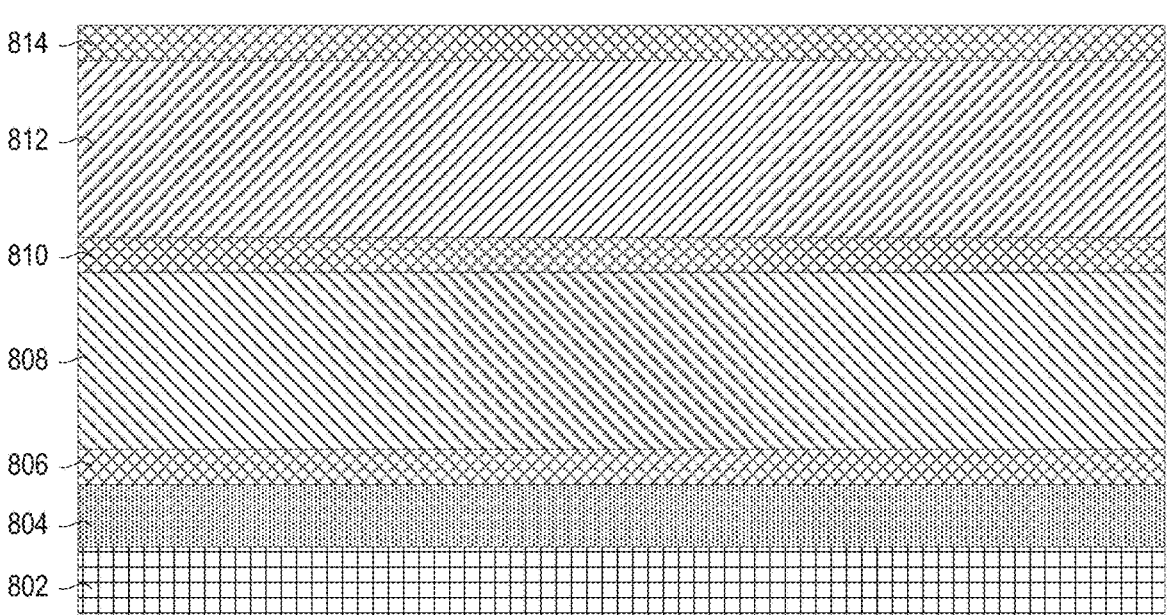
FIG. 8

800

900

814

812

810

808

806

804

802

TECHNOLOGIES FOR SEMICONDUCTOR DEVICES INCLUDING AMORPHOUS SILICON

BACKGROUND

In manufacturing certain semiconductor devices such as phase-change-based memory cells, a memory die may be etched several times. In between etchings, barrier layers may be applied to protect certain layers of the memory die. However, the barrier layers may be thick, increasing the size of components of the memory die. The barrier layers may also allow undesired oxidation of protected layers or may damage the layers when being applied.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIGS. 6 and 7 illustrate a simplified flow diagram of at least one embodiment of a method for creating a 3D crosspoint memory stack.

FIG. 8 is a cross-sectional view of one step of a manufacturing process for a 3D crosspoint memory stack.

DETAILED DESCRIPTION OF THE DRAWINGS

Figure 1:
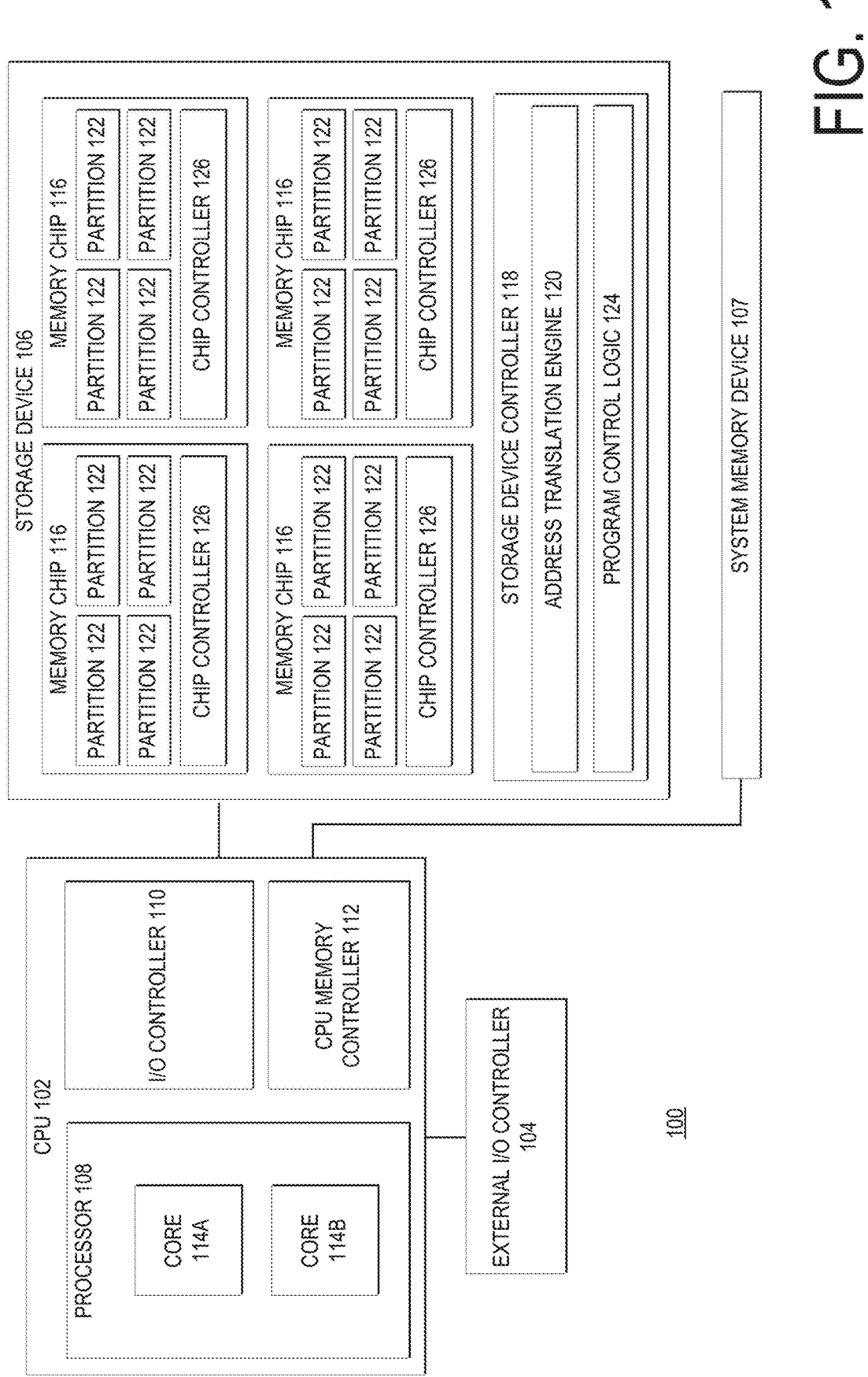
FIG. 1 illustrates components of a computer system in accordance with certain embodiments.

In the illustrative embodiment, a 3D crosspoint memory stack is created by first partially etching trenches in a phase-change material. In order to protect the phase-change material during further processing steps, amorphous silicon is applied using low-temperature chemical vapor deposition, and then the amorphous silicon is oxidized, creating a barrier layer of silicon oxide. The etching of the trenches is then continued, etching trenches through a selector layer and a bitline layer, with the barrier layer preventing the phase-change material from being etched.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a magnetic storage disk or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory control- ler 112 may be implemented on a different chip than that of CPU 102. I/O controller 110 may perform similar operations with respect to one or more storage devices 106.

The CPU 102 may also be coupled to one or more other I/O devices through external I/O controller 104. In a par- ticular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the function- ality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruc- tion sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non- volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalco- genide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable program- mable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magne- toresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsys- tem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial speci- fication published in September 2012 by JEDEC), DDR4E (DDR version 4, extended, currently in discussion by JEDEC), LPDDR3 (low power DDR version 3, JESD209- 3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), origi- nally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or other- wise used by the cores 114A and 114B. In various embodi- ments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sec- tors, or in other ways. In various embodiments, the cells may be logically grouped into banks, blocks, subblocks, word- lines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent)

bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
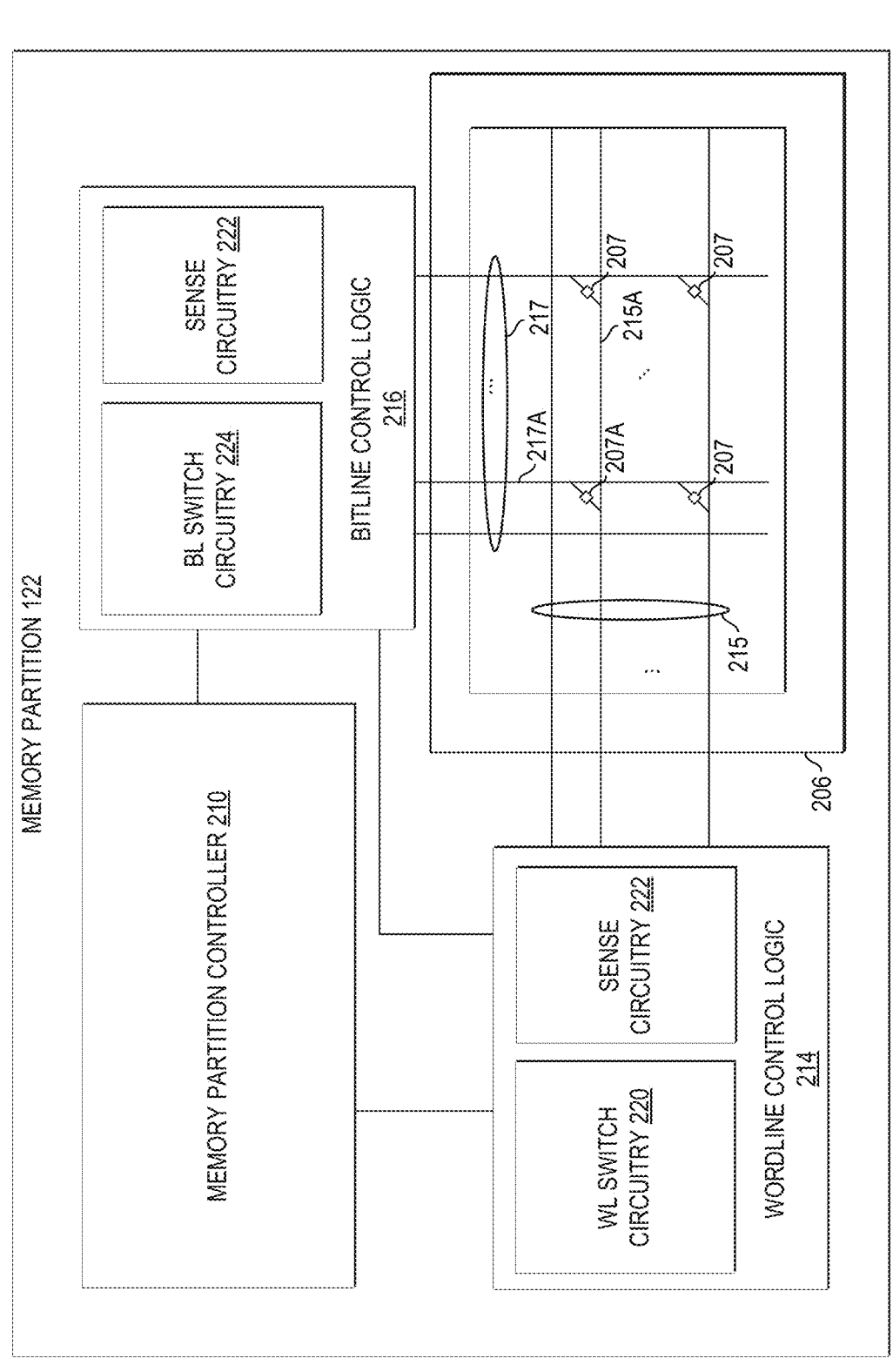
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL. It should be appreciated that which line is the "wordline" and which line is the "bitline" is arbitrary, and the label "wordline" and "bitline" may be applied to, e.g., the line connected to either the higher or lower voltage.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current ($i_{cell}$) in the memory cell 207A dependent on a program state of the memory cell. A comparator such as a sense amplifier may compare $i_{cell}$ with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

Figure 3:
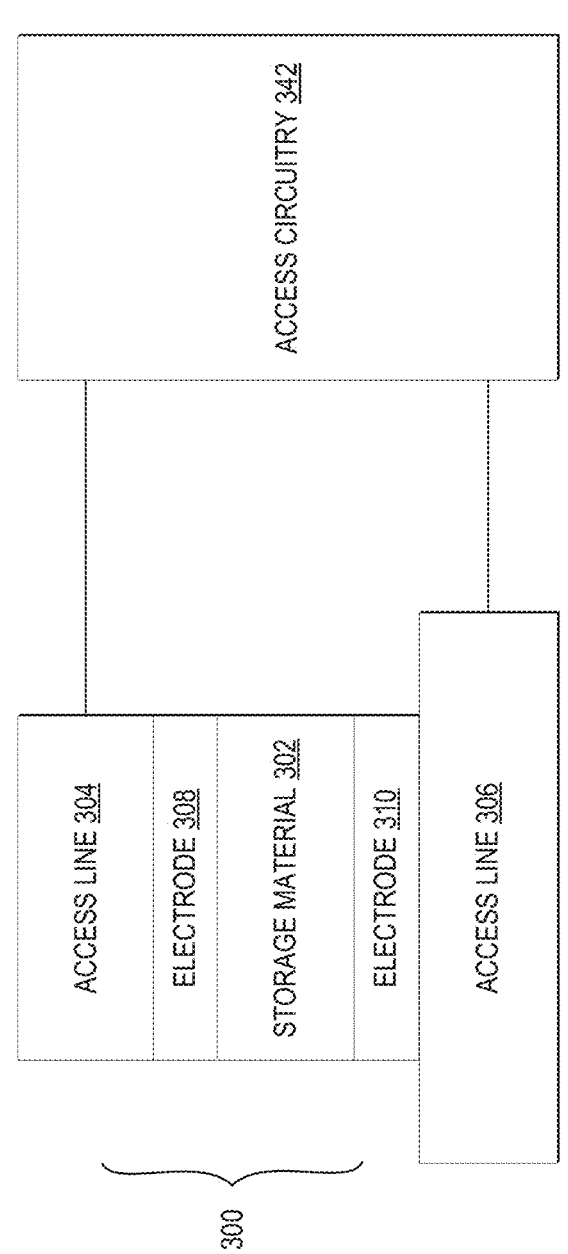
FIG. 3 illustrates a memory cell coupled to access circuitry in accordance with certain embodiments.

FIG. 3 illustrates a memory cell 300 coupled to access circuitry 342 in accordance with certain embodiments. The memory cell 300 includes a storage material 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In one embodiment, storage material 302 includes a self-selecting material that exhibits memory effects. A self-selecting material is a material that enables selection of a memory cell in an array without requiring a separate selector element. Thus, storage material 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage material 302 to be in a particular state. The storage material 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state. In the embodiment depicted, each memory cell 300 is a two-terminal device (i.e., the memory cell 300 has two electrodes to receive control signals sufficient to write to and read from the memory cell 300).

In other embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage material 302 may include any suitable material programmable to a plurality of states. In some embodiments, the storage material 302 may include a chalcogenide material comprising a chemical compound with at least one chalcogen ion, that is, an element from group 16 of the periodic table. For example, the storage material 302 may include one or more of: sulfur (S), selenium (Se), or tellurium (Te). Additionally or alternatively, in various embodiments, storage material 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage material 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage material 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage material 302) may be dopants. For example, the storage material 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage material 302) may include additional elements such as hydrogen (H), oxygen (O), nitrogen (N), chlorine (Cl), or fluorine (F), each in atomic or molecular forms. The storage material 302 may include other materials or dopants not explicitly listed. In some examples, the storage material (such as any of the materials described above) is a phase change material. In other examples, the storage material 302 is not a phase change material, e.g., can be in one or multiple stable states (or transition between stable states) without a change in phase.

In some embodiments, a selector element coupled to storage material (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage material 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may also be equivalent to a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity to induce a programming threshold event and application of current for a duration of time, which causes the memory cell 300 to exhibit a particular threshold voltage at a subsequent reading voltage of a same or different polarity. In one such embodiment, the storage material 302 is a self-selecting material that can be programmed by inducing a threshold event.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308, 310 are disposed between storage material 302 and access lines 304, 306. Electrodes 308, 310 electrically couple access lines 304, 306 to storage material 302. Electrodes 308, 310 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

The memory cell 300 is one example of a memory cell that may be used as a multi-level cell (storing more than a single logical bit). Other embodiments can include memory cells having additional or different layers of material than illustrated in FIG. 3 (e.g., a selection device between the access line 304 and the storage element, a thin dielectric material between the storage material and access lines, or other suitable configuration).

Figure 4:
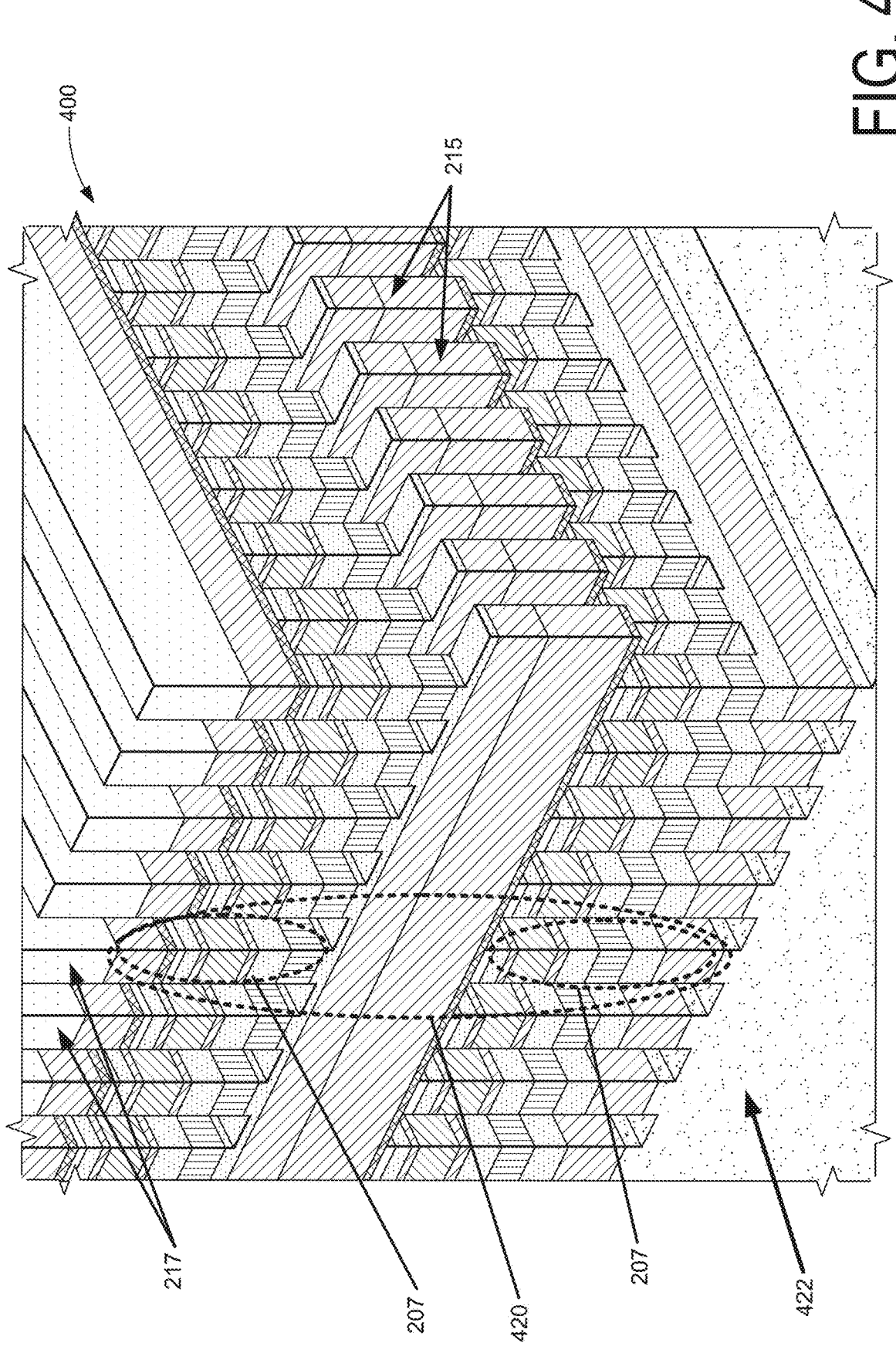
FIG. 4 is a perspective view of portions of a three-dimensional (3D) crosspoint memory stack according to one embodiment.

FIG. 4 is a perspective view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

Figure 5:
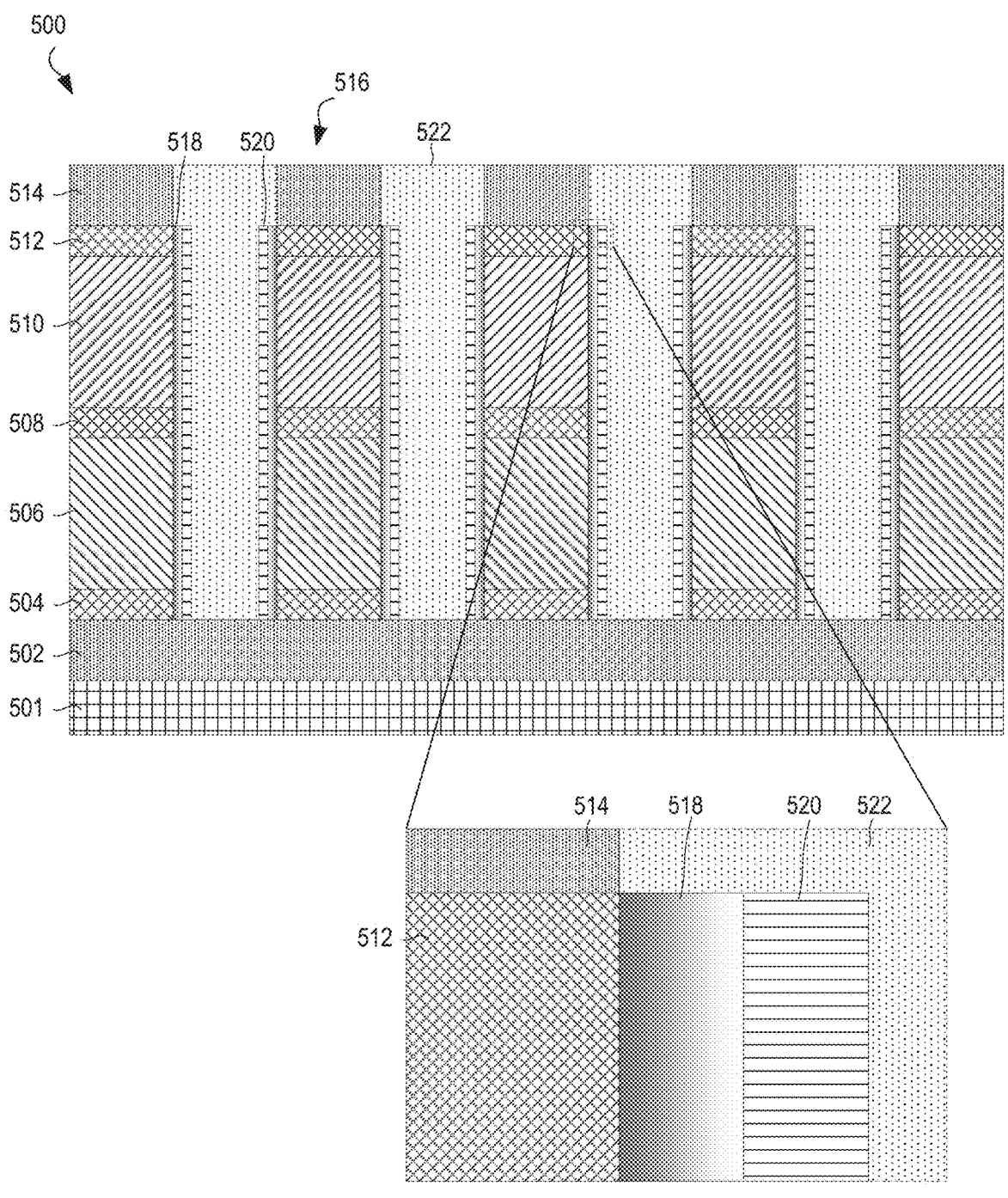
FIG. 5 is a cross-sectional view of a 3D crosspoint memory stack according to one embodiment.

Referring now to FIG. 5, in one embodiment, a cross-sectional view of a memory die 500 is shown. The memory die 500 may have similar or the same features as the stack 400 described above. The memory die 500 includes a substrate 501, which may be a silicon or other semiconductor substrate. The memory die 500 includes a bitline 502 extending parallel to the page on top of the substrate 501. The memory die 500 includes several bitlines 502 not visible in FIG. 5, similar to the row address lines 215 in FIG. 4. Several memory cell columns 516 are disposed on top of the bitline 502. It should be appreciated that, as used herein, the "top," "bottom," etc., of the bitline 502 or other layers of the memory die 500 is an arbitrary designation used for clarity and does not denote a particular required orientation for manufacture or use.

Each memory cell column 516 includes an electrode 504 adjacent a top surface of the bitline 502. A selector layer 506 is adjacent a top surface of the electrode 504. Another electrode 508 is adjacent the top surface of the selector layer 506. A phase-change layer 510 is adjacent the top surface of the electrode 508. A third electrode 512 is adjacent the top surface of the phase-change layer 510. A wordline 514 is adjacent the top surface of the electrode 512. In the illustrative embodiment, each memory cell column 516 has a cross-section from a top-down view that is approximately square or is approximately a low-aspect-ratio rectangle.

In the illustrative embodiment, a barrier layer 518 is adjacent the sides of the electrodes 504, 508, 512, the selector layer 506, and the phase-change layer 510. The barrier layer 518 may surround the memory cell column 516. The barrier layer 518 and electrodes 504, 508, 512 may completely seal the phase-change layer 510 and the selector layer 506, protecting them during parts of the manufacturing process, as discussed in more detail below. In some embodiments, a second barrier layer 520 such as silicon nitride may be on top of the barrier layer 518. A dielectric layer 522 may be added to fill in space between the memory cell columns 516.

The bitline 502 and/or the wordline 514 may be made of any suitable conductive material, such as tungsten, copper, aluminum, etc. The illustrative electrodes 504, 508, 512 are made from conductive carbon. In other embodiments, the electrodes 504, 508, 512 may be made of any suitable conductive material. The selector layer 506 may be any suitable selector material described above, such as a chalcogenide. In the illustrative embodiment, the phase-change layer 510 is germanium-antimony-tellurium or GST. In other embodiments, the phase-change layer 510 may be any phase-change material described above, such as a chalcogenide.

In the illustrative embodiment, the barrier layer 518 is silicon-rich silicon oxide. The illustrative barrier layer 518 has a gradient of silicon richness, being richer in silicon at an inside surface near the enclosed selector layer 506 and phase-change layer 510, and less rich (or not rich) in silicon on the outside surface opposite the inside surface of the barrier layer 518. Different parts of the barrier layer may be described by the empirical formula $SiO_x$, where x may vary from, e.g., 0-2 at any suitable part of the barrier. In some embodiments, the barrier layer 518 may be silicon oxide that is not silicon rich. In some embodiments, some or all of the barrier layer 518 may be amorphous silicon. The illustrative barrier layer 518 has a thickness of about 3 nanometers. In other embodiments, the barrier layer 518 may have any suitable thickness, such as 1-10 nanometers. In some embodiments, the barrier layer 518 may have a different thickness in different parts. For example, the barrier layer 518 may have a different thickness around the phase-change layer 510 than around the selector layer 506. In some embodiments, the barrier layer 518 may not surround some of the layers 504, 506, 508, 510, 512. For example, in one embodiment, the barrier layer 518 may surround the electrode 512, the phase-change layer 510, and the electrode 508 but may not surround the selector 506 or the electrode 504.

The second barrier layer 520 may be any suitable material, such as silicon nitride. The illustrative second barrier layer 520 has a thickness of about 3 nanometers. In other embodiments, the second barrier layer 520 may have any suitable thickness, such as 1-10 nanometers. In some embodiments, the memory die 500 may not have a second barrier layer 520.

It should be appreciated that the structure shown in FIG. 5 is merely a part of the overall memory die 500, and the memory die 500 may include, e.g., layers above and/or below those shown in FIG. 5. For example, the memory die 500 may have a substrate made of, e.g., silicon and may include one or more additional layers of memory cells.

Referring now to FIG. 6, in use, a flowchart for performing a method 600 for manufacturing a memory die is shown. The method 600 may be executed by a technician and/or by one or more automated machines. In some embodiments, one or more machines may be programmed to do some or all of the steps of the method 600. Such a machine may include, e.g., a memory, a processor, data storage, etc. The memory and/or data storage may store instructions that, when executed by the machine, causes the machine to perform some or all of the steps of the method 600. The method 600 may use any suitable set of techniques that are used in semiconductor processing, such as chemical vapor deposition, atomic layer deposition, physical layer deposition, molecular beam epitaxy, layer transfer, photolithography, ion implantation, dry etching, wet etching, thermal treatments, flip chip, layer transfer, magnetron sputter deposition, pulsed laser deposition, etc. It should be appreciated that the method 600 is merely one embodiment of a method to create a memory die, and other methods may be used to create a memory die. In some embodiments, steps of the method 600 may be performed in a different order than that shown in the flowchart.

The method 600 begins in block 602, in which several layers of a memory cell are formed on a substrate 802 of a memory die 800, as shown in FIG. 8. FIG. 8 shows a cross-sectional view of the memory die 800, which includes a bitline layer 804, an electrode layer 806, a selector layer 808, an electrode layer 810, a phase-change layer 812, and an electrode layer 814, as shown in the figure. In the illustrative embodiment, the layers 804, 806, 808, 810, 812, 814 are initially layers uniformly applied to the substrate 802 without any features within each layer. The layers 804, 806, 808, 810, 812, 814 may be applied in any suitable manner, such as chemical vapor deposition, atomic layer deposition, physical layer deposition, molecular beam epitaxy, layer transfer, etc. Each of the layers 804, 806, 808, 810, 812, 814 may be a similar material to the corresponding layers 502, 504, 506, 508, 510, 512, a description of which will not be repeated in the interest of clarity.

Figure 9:
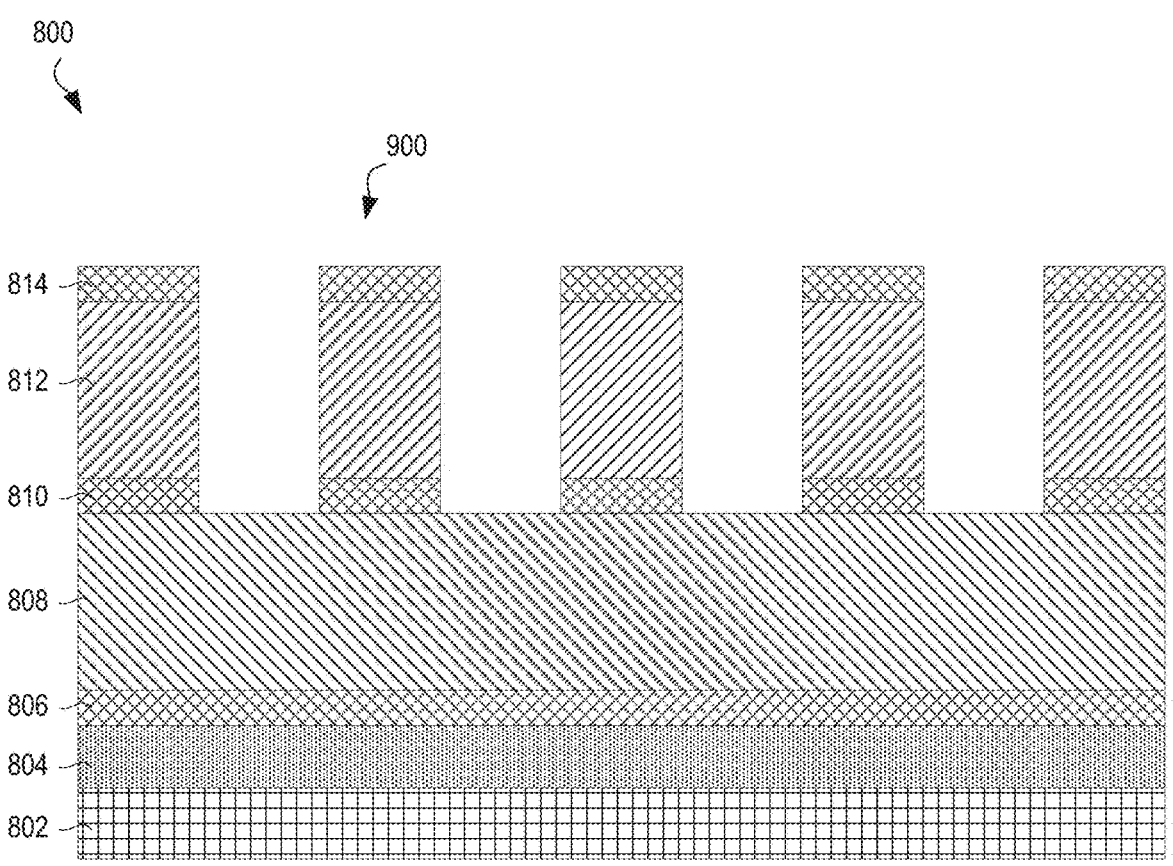
FIG. 9 is a cross-sectional view of one step of a manufacturing process for a 3D crosspoint memory stack.

In block 604, several trenches are partially etched on the memory die 800, as shown in FIG. 9. In particular, in the illustrative embodiment, trenches are etched through the electrode layer 814, the phase-change layer 812, and the electrode layer 810, stopping before etching the selector layer 808. Etching the trenches forms one or more strips 900 extending into and out of the page.

Figure 10:
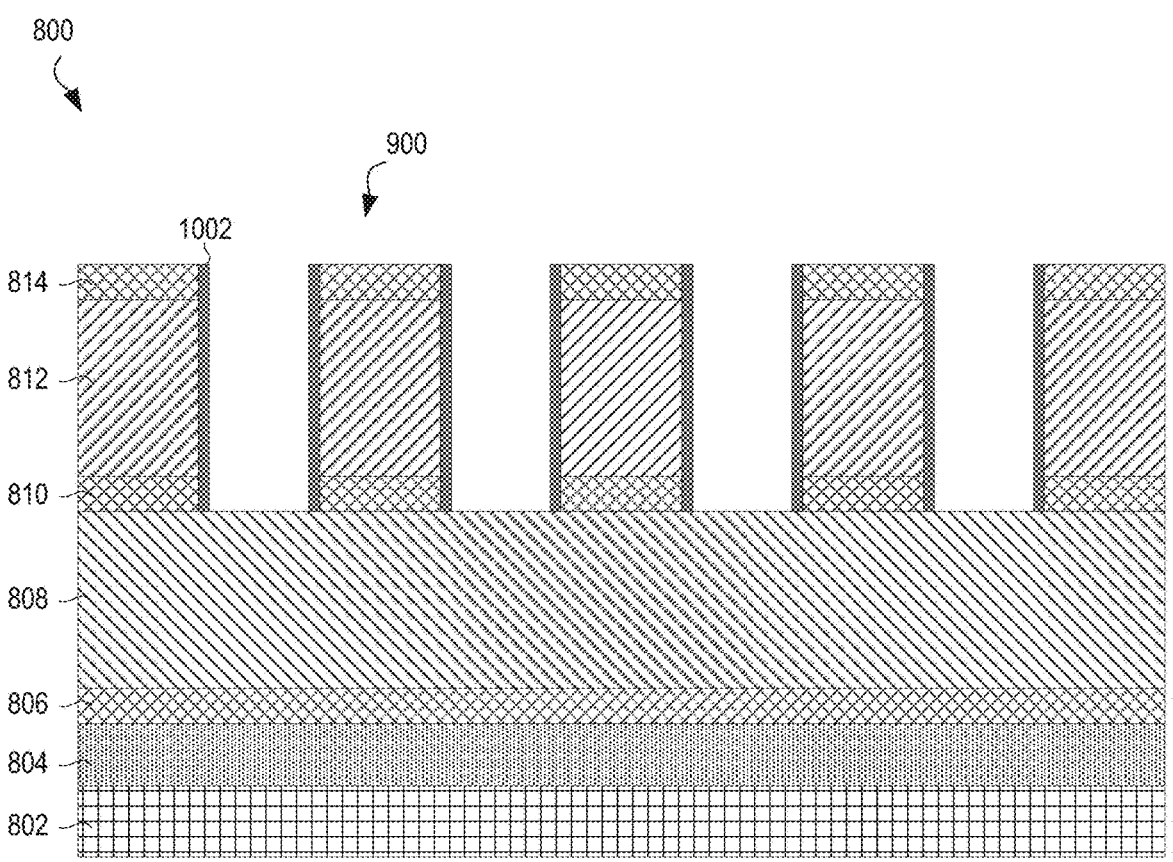
FIG. 10 is a cross-sectional view of one step of a manufacturing process for a 3D crosspoint memory stack.

In block 606, an amorphous silicon layer 1002 is applied to the sides of the trench. In the illustrative embodiment, the amorphous silicon layer 1002 is applied using a low-temperature chemical vapor deposition (LT-CVD) process, as shown in FIG. 10. In the LT-CVD process, the memory die 800 is at a relatively low temperature, such as less than 300° C. In particular, during the LT-CVD process, the phase-change layer 812 is kept at a temperature below its melting point, preventing damage to the phase-change layer 812. For example, the melting point of the phase-change layer 812 may be, e.g., 400-800° C., higher than the temperature in the LT-CVD process. The LT-CVD process may use certain precursors to provide a source of silicon during the CVD process. Depending on the precursor used, the amorphous silicon layer 1002 (and the silicon oxide layer 1102 described below) may contain small amounts of elements in the precursors, such as chlorine or boron.

Figure 11:
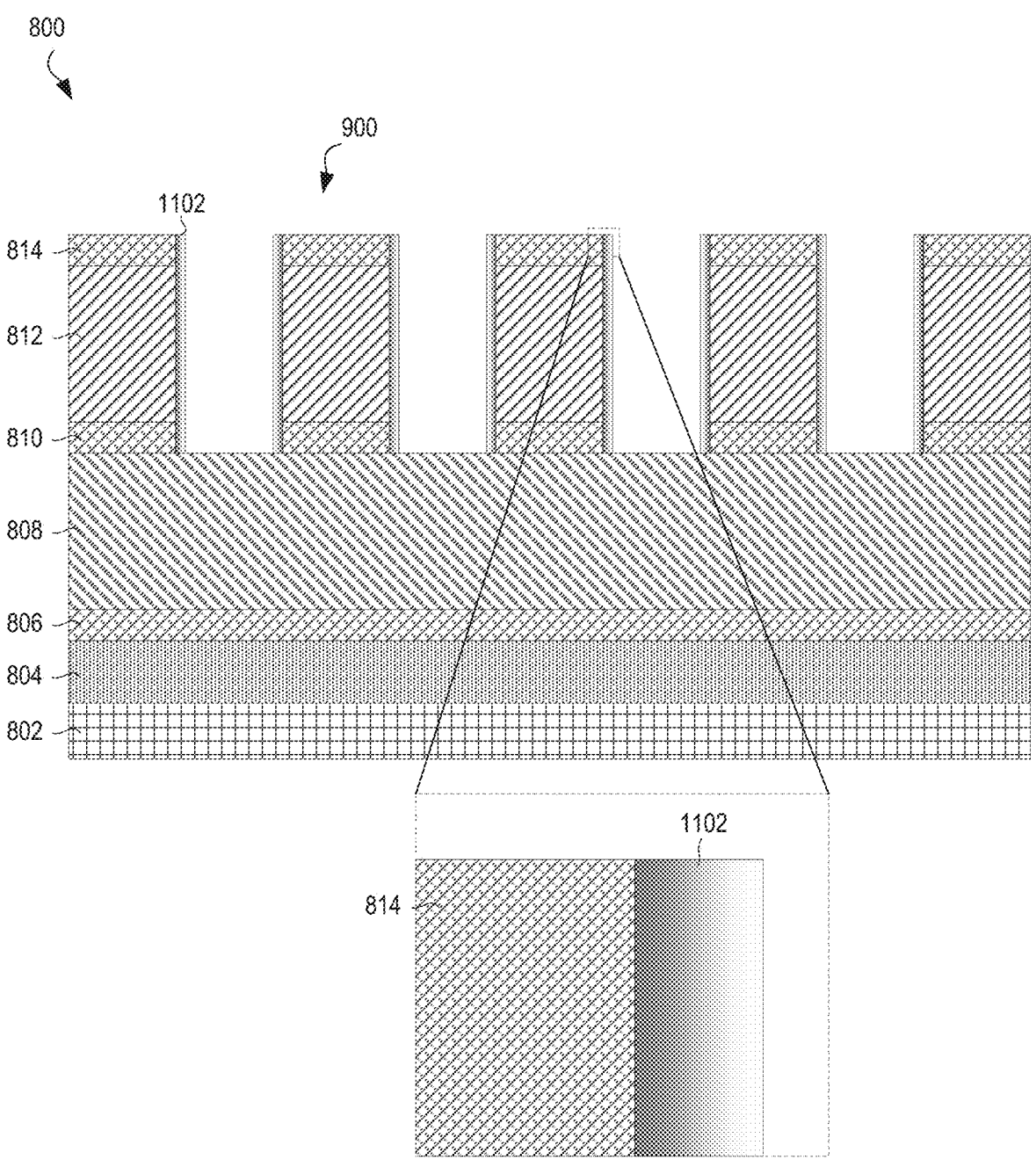
FIG. 11 is a cross-sectional view of one step of a manufacturing process for a 3D crosspoint memory stack.

In block 608, the amorphous silicon layer 1002 is oxidized, forming a silicon oxide layer 1102, as shown in FIG. 11. The amorphous silicon layer 1002 may be fully or partially oxidized. In the illustrative embodiment, the silicon oxide layer 1102 is silicon rich, with more silicon present at the interface with the other layers 814, 812, 810 and less silicon on the opposite side. Allowing the silicon oxide layer

1102 to remain silicon rich at the interface with the phase-change layer 814 may prevent any significant oxidation of the phase-change layer 814, which may otherwise reduce the performance of the phase-change layer 814 in a memory cell. In the illustrative embodiment, the silicon oxide layer 1102 may be bonded to the electrode layers 810, 814 but may not be well bonded to the phase-change layer 812. However, as the silicon oxide layer 1102 is bonded to the electrode layers 810, 814, it remains secured in place relative to the phase-change layer 812. Optionally, in some embodiments, a silicon nitride layer may be applied over the silicon oxide layer 1102 in block 610. The silicon nitride layer may be applied using any suitable technique, such as plasma-enhanced atomic layer deposition (PEALD).

Figure 12:
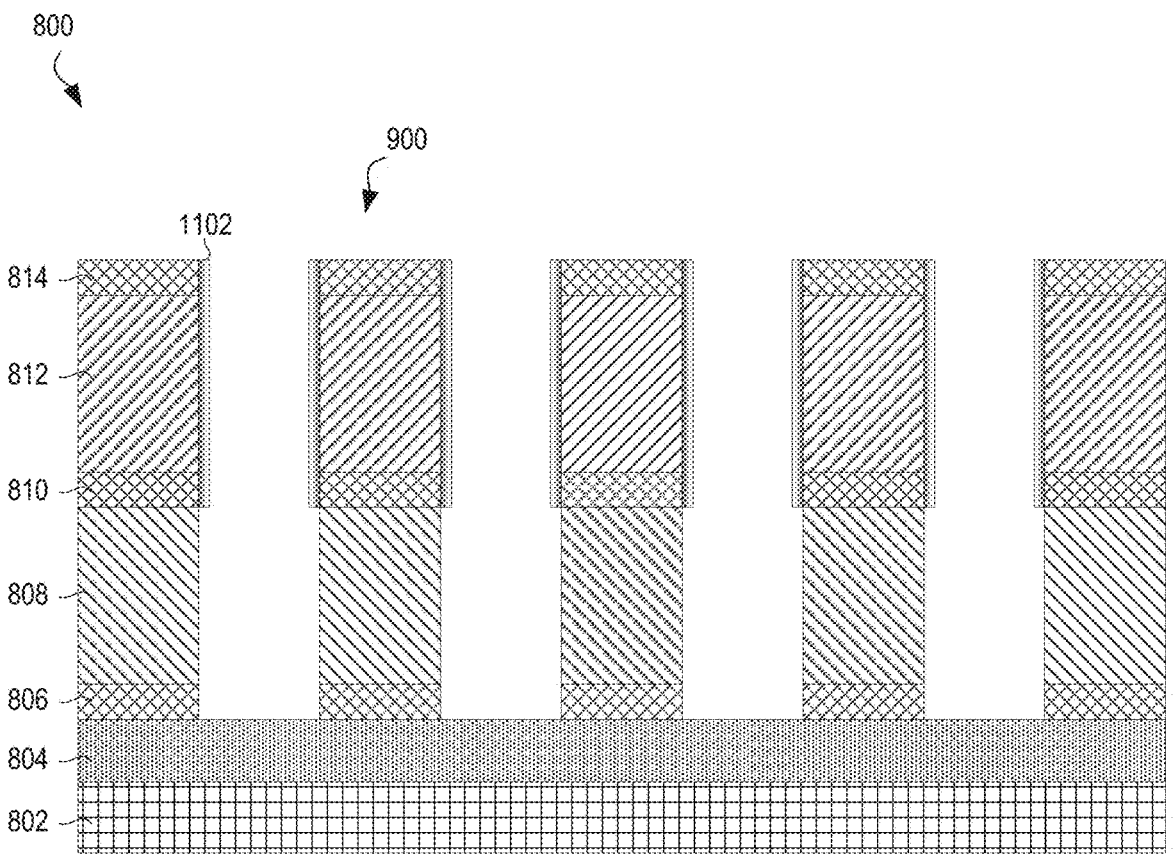
FIG. 12 is a cross-sectional view of one step of a manufacturing process for a 3D crosspoint memory stack.

In block 612, the trenches are fully etched through the selector layer 808 and the electrode layer 806, as shown in FIG. 12. When the selector layer 808 and electrode layer 806 are being etched, the silicon oxide layer 1102 protects the phase-change layer 812, preventing it from being damaged. In the illustrative embodiment, the first trenches do not etch through the bitline layer 804. In other embodiments, the etching of the trenches may extend through the bitline layer 804 to the substrate 802.

Figure 13:
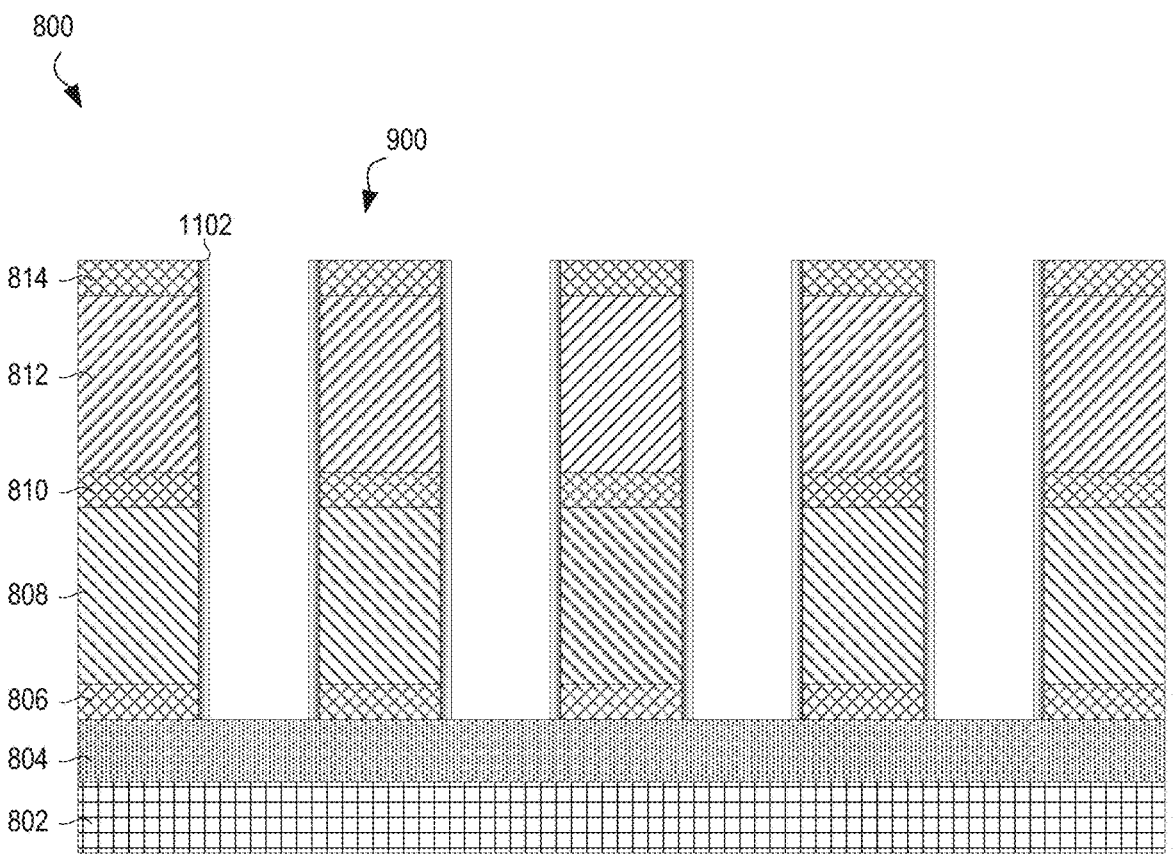
FIG. 13 is a cross-sectional view of one step of a manufacturing process for a 3D crosspoint memory stack.
Figure 14:
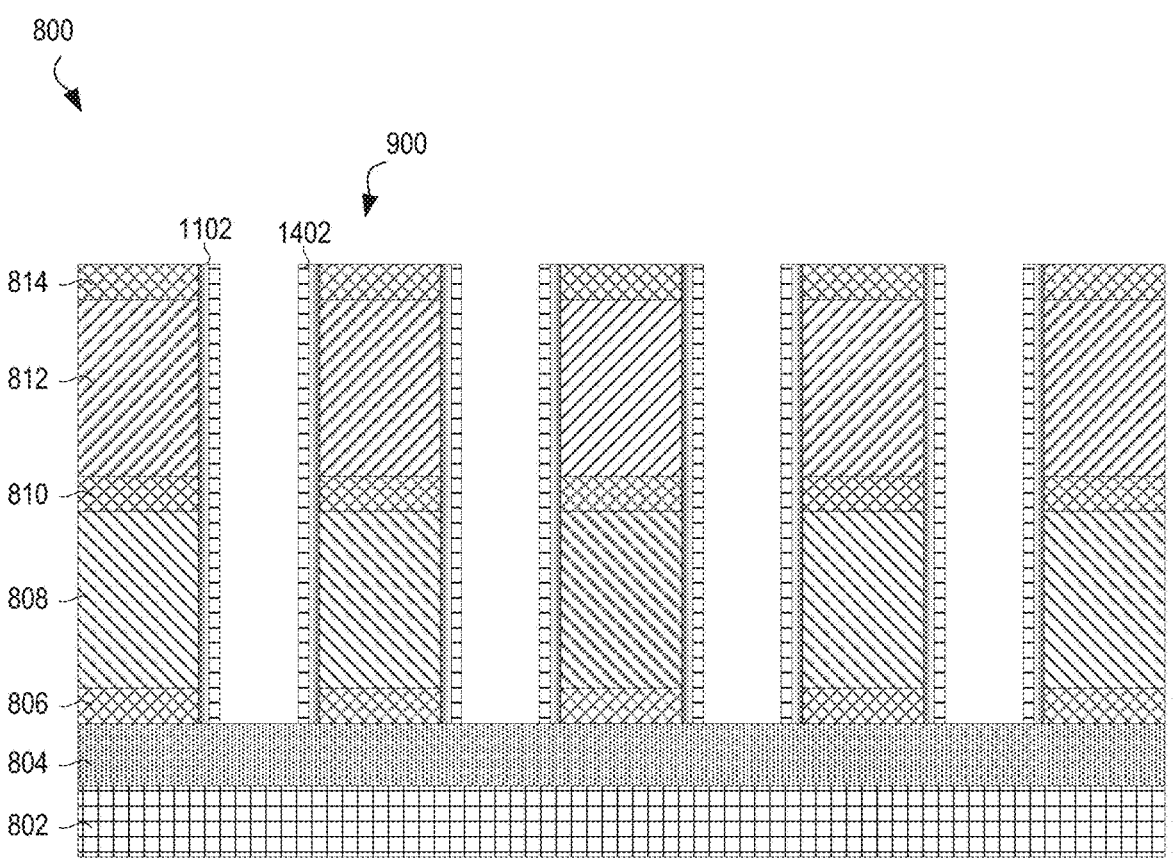
FIG. 14 is a cross-sectional view of one step of a manufacturing process for a 3D crosspoint memory stack.

In block 614, an amorphous silicon layer is applied to the newly exposed sides of the trench, on the selector layer 808 and the electrode layer 806. The amorphous silicon is oxidized in block 616, as shown in FIG. 13. Optionally, in some embodiments, a silicon nitride layer 1402 may be applied over the silicon oxide layer 1102 in block 618.

Figure 7:
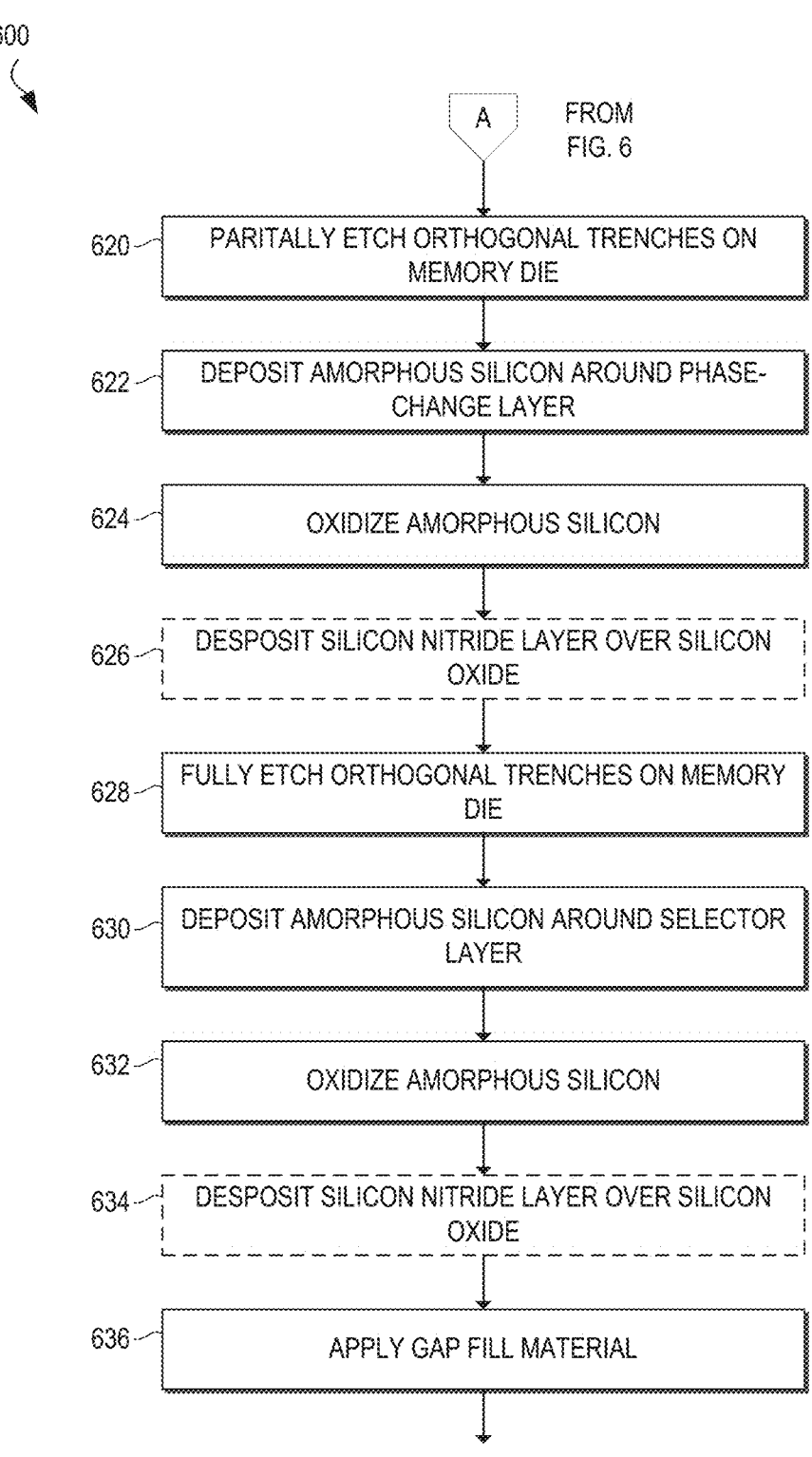

With one set of tranches etched, the method 600 continues on FIG. 7 in block 620, in which trenches orthogonal to the previously-created trenches are partially etched through the electrode layer 814, phase-change layer 812, and electrode layer 810, forming a partial memory cell column. An amorphous silicon layer is applied to the sides of the new trenches in block 822, and the amorphous silicon layer is oxidized in block 624. Optionally, in some embodiments, a silicon nitride layer may be applied over the silicon oxide layer in block 626.

In block 628, the orthogonal trenches are fully etched, through the selector layer 808, the electrode layer 806, and the bitline layer 804. An amorphous silicon layer is applied to the selector layer 808 in block 630, and the amorphous silicon layer is oxidized in block 632. Optionally, in some embodiments, a silicon nitride layer may be applied over the silicon oxide layer in block 634. In block 636, a gap fill material 522 is applied, filling the space between the memory cell columns 516.

It should be appreciated that a silicon oxide layer 518, together with electrodes 512, 508 now fully encloses the phase-change layer 510 of each memory cell column 516, as shown in FIG. 5. Similarly, the silicon oxide layer 518, together with electrodes 508, 504 now fully encloses the selector layer 506 of each memory cell column 516, as shown in FIG. 5.

It should be appreciated that the method 600 describes fabrication of one layer of memory cell columns 516, and that other layers may be fabricated above or below the layer described. Additionally, the method 600 may include additional fabrication steps not explicitly described in the method 600.

Examples

Illustrative examples of the technologies disclosed herein are provided below. An embodiment of the technologies may include any one or more, and any combination of, the examples described below.

Example 1 includes a memory die comprising a plurality of memory cells, wherein individual memory cells of the plurality of memory cells comprise a first electrode; a selector layer located on top of the first electrode; a second electrode located on top of the selector layer; a phase-change layer located on top of the second electrode; a third electrode located on top of the phase-change layer; and a barrier layer comprising silicon and oxygen, wherein the barrier layer is adjacent the phase-change layer, wherein the barrier layer, the second electrode, and the third electrode surround the phase-change layer in a cross-section of the memory cell.

Example 2 includes the subject matter of Example 1, and wherein the barrier layer of individual memory cells of the plurality of memory cells has an inside surface adjacent the phase-change layer and an outside surface opposite the inside surface, wherein the barrier layer of individual memory cells of the plurality of memory cells has a gradient of silicon concentration, wherein the barrier layer of individual memory cells of the plurality of memory cells has a higher silicon concentration at the inside surface than at the outside surface.

Example 3 includes the subject matter of any of Examples 1 and 2, and wherein individual memory cells of the plurality of memory cells further comprise a barrier layer comprising silicon and nitrogen surrounding the barrier layer comprising silicon and oxygen.

Example 4 includes the subject matter of any of Examples 1-3, and wherein the barrier layer of individual memory cells of the plurality of memory cells has a thickness of 1-10 nanometers.

Example 5 includes the subject matter of any of Examples 1-4, and wherein the barrier layer of individual memory cells of the plurality of memory cells has an average empirical formula SiOx, where x is between 0.1 and 2.

Example 6 includes the subject matter of any of Examples 1-5, and wherein the barrier layer of individual memory cells of the plurality of memory cells is adjacent the selector layer, wherein, for individual memory cells of the plurality of memory cells, the barrier layer, the first electrode, and the second electrode fully surround the selector layer.

Example 7 includes the subject matter of any of Examples 1-6, and wherein the phase-change layer of individual memory cells of the plurality of memory cells is an alloy of germanium, antimony, and tellurium.

Example 8 includes the subject matter of any of Examples 1-7, and wherein the selector layer of individual memory cells of the plurality of memory cells is a chalcogenide material that exhibits ovonic threshold switching.

Example 9 includes the subject matter of any of Examples 1-8, and wherein the first electrode, second electrode, and third electrode of individual memory cells of the plurality of memory cells comprises conductive carbon.

Example 10 includes the subject matter of any of Examples 1-9, and wherein the barrier layer is partially oxidized silicon.

Example 11 includes the subject matter of any of Examples 1-10, and wherein the barrier layer is fully oxidized silicon.

Example 12 includes the subject matter of any of Examples 1-11, and wherein, for individual memory cells of the plurality of memory cells, the barrier layer, the second electrode, and the third electrode fully surround the phase-change layer.

Example 13 includes a system comprising the memory die of any of Examples 1-12, the system further comprising a processor communicatively coupled to the memory die.

Example 14 includes a method comprising etching one or more trenches in a phase-change layer in a memory die; depositing a silicon barrier layer on a side of the phase-change layer in the one or more trenches using low-temperature chemical vapor deposition; oxidizing the silicon barrier layer; and etching one or more trenches in a selector layer of the memory die, wherein the oxidized silicon barrier layer protects the phase-change layer during etching of the one or more trenches in the selector layer.

Example 15 includes the subject matter of Example 14, the method further comprising depositing a silicon barrier layer on a side of the selection layer in the one or more trenches using low-temperature chemical vapor deposition; and oxidizing the silicon barrier layer on the side of the selection layer.

Example 16 includes the subject matter of any of Examples 14-15, the method further comprising etching one or more additional trenches in the phase-change layer in the memory die, wherein the one or more additional trenches are orthogonal to the one or more trenches, wherein the oxidized silicon barrier layer on the phase-change layer protects the phase-change layer during etching of the one or more additional trenches, wherein the oxidized silicon barrier layer on the selector layer protects the selector layer during etching of the one or more additional trenches, depositing a silicon barrier layer on a side of the phase-change layer in the one or more additional trenches using low-temperature chemical vapor deposition; oxidizing the silicon barrier layer on the side of the phase-change layer in the one or more additional trenches; and etching one or more additional trenches in the selector layer of the memory die, wherein the oxidized silicon barrier layer on the side of the phase-change layer in the one or more additional trenches protects the phase-change layer during etching of the one or more additional trenches in the selector layer.

Example 17 includes the subject matter of any of Examples 14-16, and wherein the oxidized silicon barrier layer has a gradient of silicon concentration, wherein the oxidized silicon barrier layer has a higher silicon concentration adjacent the phase-chance layer than at an interface with the one or more trenches.

Example 18 includes the subject matter of any of Examples 14-17, and further including depositing an additional barrier layer around the oxidized silicon barrier layer using plasma-enhanced atomic layer deposition.

Example 19 includes the subject matter of any of Examples 14-18, and wherein the additional barrier layer is silicon nitride.

Example 20 includes the subject matter of any of Examples 14-19, and wherein the oxidized silicon barrier layer has a thickness of 1-10 nanometers.

Example 21 includes the subject matter of any of Examples 14-20, and wherein the oxidized silicon barrier layer has an average empirical formula SiOx, where x is between 0.1 and 2.

Example 22 includes the subject matter of any of Examples 14-21, and wherein the phase-change layer is an alloy of germanium, antimony, and tellurium.

Example 23 includes the subject matter of any of Examples 14-22, and wherein the selector layer is a chalcogenide material that exhibits ovonic threshold switching.

Example 24 includes the subject matter of any of Examples 14-23, and wherein oxidizing the silicon barrier layer comprises only partially oxidizing the silicon barrier layer.

Example 25 includes the subject matter of any of Examples 14-24, and wherein oxidizing the silicon barrier layer comprises fully oxidizing the silicon barrier layer.

Example 26 includes a memory die comprising a plurality of memory cells, wherein individual memory cells of the plurality of memory cells comprise a first layer, wherein the first layer comprises a phase-change memory material, wherein the first layer comprises a top surface, a bottom surface, and one or more side surfaces; a second layer adjacent the top surface of the first layer; a third layer adjacent the bottom surface of the first layer; and a barrier layer comprising silicon and oxygen that surrounds the one or more side surfaces of the first layer, wherein the second layer, the third layer, and the barrier layer encapsulate the first layer in a cross-section of the corresponding memory cell of the plurality of memory cells.

Example 27 includes the subject matter of Example 26, and wherein the barrier layer of individual memory cells of the plurality of memory cells has an inside surface adjacent the first layer and an outside surface opposite the inside surface, wherein the barrier layer of individual memory cells of the plurality of memory cells has a gradient of silicon concentration, wherein the barrier layer of individual memory cells of the plurality of memory cells has a higher silicon concentration at the inside surface than at the outside surface.

Example 28 includes the subject matter of any of Examples 26 and 27, and wherein individual memory cells of the plurality of memory cells further comprise a barrier layer comprising silicon and nitrogen surrounding the barrier layer comprising silicon and oxygen.

Example 29 includes the subject matter of any of Examples 26-28, and wherein the barrier layer of individual memory cells of the plurality of memory cells has a thickness of 1-10 nanometers.

Example 30 includes the subject matter of any of Examples 26-29, and wherein the barrier layer of individual memory cells of the plurality of memory cells has an average empirical formula SiOx, where x is between 0.1 and 2.

Example 31 includes the subject matter of any of Examples 26-30, and wherein individual memory cells of the plurality of memory cells further comprise a selector layer adjacent a bottom surface of the third layer and a fourth layer adjacent a bottom surface of the selector layer, wherein the barrier layer of individual memory cells of the plurality of memory cells is adjacent the selector layer, wherein, for individual memory cells of the plurality of memory cells, the barrier layer, the third layer, and the fourth layer fully surround the selector layer.

Example 32 includes the subject matter of any of Examples 26-31, and wherein the selector layer of individual memory cells of the plurality of memory cells is a chalcogenide material that exhibits ovonic threshold switching.

Example 33 includes the subject matter of any of Examples 26-32, and wherein the phase-change memory material of individual memory cells of the plurality of memory cells is an alloy of germanium, antimony, and tellurium.

Example 34 includes the subject matter of any of Examples 26-33, and wherein the second layer and the third layer of individual memory cells of the plurality of memory cells comprises conductive carbon.

Example 35 includes the subject matter of any of Examples 26-34, and wherein the barrier layer is partially oxidized silicon.

Example 36 includes the subject matter of any of Examples 26-35, and wherein the barrier layer is fully oxidized silicon.

Example 37 includes the subject matter of any of Examples 26-36, and wherein, for individual memory cells of the plurality of memory cells, the second layer, the third layer, and the barrier layer fully encapsulate the first layer.

Example 38 includes a system comprising the memory die of any of Examples 26-37, the system further comprising a processor communicatively coupled to the memory die.

The invention claimed is:

1. A memory die comprising:
a plurality of memory cells, wherein individual memory cells of the plurality of memory cells comprise:
  a first electrode;
  a selector layer located on top of the first electrode;
  a second electrode located on top of the selector layer;
  a phase-change layer located on top of the second electrode;
  a third electrode located on top of the phase-change layer; and
  a barrier layer comprising silicon and oxygen, wherein the barrier layer is adjacent the phase-change layer, wherein the barrier layer, the second electrode, and the third electrode surround the phase-change layer in a cross-section of the corresponding memory cell of the plurality of memory cells,
wherein the barrier layer of individual memory cells of the plurality of memory cells has an inside surface adjacent the phase-change layer and an outside surface opposite the inside surface,
wherein the barrier layer of individual memory cells of the plurality of memory cells has a gradient of silicon concentration, wherein the barrier layer of individual memory cells of the plurality of memory cells has a higher silicon concentration at the inside surface than at the outside surface.

2. The memory die of claim 1, wherein individual memory cells of the plurality of memory cells further comprise a barrier layer comprising silicon and nitrogen surrounding the barrier layer comprising silicon and oxygen.

3. The memory die of claim 1, wherein the barrier layer of individual memory cells of the plurality of memory cells has a thickness of 1-10 nanometers.

4. The memory die of claim 1, wherein the barrier layer of individual memory cells of the plurality of memory cells has an average empirical formula $SiO_x$, where x is between 0.1 and 2.

5. The memory die of claim 1, wherein the barrier layer of individual memory cells of the plurality of memory cells is adjacent the selector layer, wherein, for individual memory cells of the plurality of memory cells, the barrier layer, the first electrode, and the second electrode fully surround the selector layer.

6. The memory die of claim 1, wherein the phase-change layer of individual memory cells of the plurality of memory cells is an alloy of germanium, antimony, and tellurium.

7. The memory die of claim 1, wherein the selector layer of individual memory cells of the plurality of memory cells is a chalcogenide material that exhibits ovonic threshold switching.

8. The memory die of claim 1, wherein the first electrode, second electrode, and third electrode of individual memory cells of the plurality of memory cells comprises conductive carbon.

9. The memory die of claim 1, wherein the barrier layer is partially oxidized silicon.

10. The memory die of claim 1, wherein the barrier layer is fully oxidized silicon.

11. The memory die of claim 1, wherein, for individual memory cells of the plurality of memory cells, the barrier layer, the second electrode, and the third electrode fully surround the phase-change layer.

12. A system comprising the memory die of claim 1, the system further comprising a processor communicatively coupled to the memory die.

13. A memory die comprising:

a plurality of memory cells, wherein individual memory cells of the plurality of memory cells comprise:

a first layer, wherein the first layer comprises a phase-change memory material, wherein the first layer comprises a top surface, a bottom surface, and one or more side surfaces;

a second layer adjacent the top surface of the first layer;

a third layer adjacent the bottom surface of the first layer; and a barrier layer comprising silicon and oxygen that surrounds the one or more side surfaces of the first layer, wherein the second layer, the third layer, and the barrier layer fully encapsulate the first layer, wherein the barrier layer of individual memory cells of the plurality of memory cells has an inside surface adjacent the first layer and an outside surface opposite the inside surface, wherein the barrier layer of individual memory cells of the plurality of memory cells has a gradient of silicon concentration, wherein the barrier layer of individual memory cells of the plurality of memory cells has a higher silicon concentration at the inside surface than at the outside surface.

14. The memory die of claim 13, wherein, for individual memory cells of the plurality of memory cells, the second layer, the third layer, and the barrier layer fully encapsulate the first layer.

15. A memory die comprising:

a plurality of memory cells, wherein individual memory cells of the plurality of memory cells comprise:

a phase-change material region;

a first electrode and a second electrode on respective opposite sides of the phase-change material region;

a selector material region electrically coupled in series with the phase-change material region; and a barrier layer comprising silicon and oxygen, the barrier layer having an inside surface facing the phase-change material region and an outside surface opposite the inside surface, the barrier layer being adjacent at least one side surface of the phase-change material region, wherein, for individual memory cells of the plurality of memory cells, the first electrode, the second electrode, and the barrier layer collectively encapsulate the phase-change material region in a cross-section of the memory cell, wherein, for individual memory cells of the plurality of memory cells, the barrier layer has a gradient of silicon concentration such that a silicon concentration at the inside surface is higher than a silicon concentration at the outside surface.

16. The memory die of claim 15, wherein the barrier layer has a thickness of 1 nanometer to 10 nanometers.

17. The memory die of claim 15, further comprising a silicon nitride barrier layer surrounding the barrier layer comprising silicon and oxygen.

18. The memory die of claim 15, wherein the barrier layer has an average empirical formula $SiO_x$, where x is between 0.1 and 2.

* * * * *